United States Patent
Yasui et al.

(10) Patent No.: US 7,506,441 B2
(45) Date of Patent: Mar. 24, 2009

(54) METHOD FOR MANUFACTURING A PIEZOELECTRIC FILM ON A SUBSTRATE

(75) Inventors: Motohiro Yasui, Nagoya (JP); Jun Akedo, Tsukuba (JP)

(73) Assignees: Brother Kogyo Kabushiki Kaisha, Nagoya (JP); National Institute of Advanced Industrial Science and Technology, Tokyo (JP)

( * ) Notice: Subject to any disclaimer, the term of this patent is extended or adjusted under 35 U.S.C. 154(b) by 366 days.

(21) Appl. No.: 11/090,201

(22) Filed: Mar. 28, 2005

(65) Prior Publication Data

US 2005/0225208 A1 Oct. 13, 2005

(30) Foreign Application Priority Data

Mar. 30, 2004 (JP) .............................. 2004-099006

(51) Int. Cl.
*B21D 53/76* (2006.01)
(52) U.S. Cl. ..................................... 29/890.1; 29/25.35
(58) Field of Classification Search ................ 29/25.35, 29/830, 831, 832, 834, 840, 843; 310/328, 310/311, 313 A; 264/429, 636, 4.33, 4.7, 264/4, 33, 7; 427/100, 180
See application file for complete search history.

(56) References Cited

U.S. PATENT DOCUMENTS

| | | | | |
|---|---|---|---|---|
| 5,221,870 A | * | 6/1993 | Nakahata et al. | 310/313 A |
| 5,221,872 A | * | 6/1993 | Nishida et al. | 310/358 |
| 5,600,197 A | * | 2/1997 | Takeuchi et al. | 310/328 |
| 6,013,311 A | | 1/2000 | Chatterjee et al. | |
| 6,235,118 B1 | * | 5/2001 | Hayashi | 118/708 |
| 6,297,579 B1 | * | 10/2001 | Martin et al. | 310/330 |
| 6,373,461 B1 | * | 4/2002 | Hasegawa et al. | 345/107 |
| 6,469,421 B1 | * | 10/2002 | Wakabayashi et al. | 310/328 |
| 6,531,187 B2 | * | 3/2003 | Akedo | 427/475 |
| 2001/0044259 A1 | * | 11/2001 | Akedo | 451/38 |

FOREIGN PATENT DOCUMENTS

| | | |
|---|---|---|
| EP | 1 231 294 A1 | 8/2002 |
| JP | A 11-330577 | 11/1999 |

(Continued)

OTHER PUBLICATIONS

Kenta Takagi et al., "Development of Piezoelectric Ceramic Actuators with Graded Porosity," Material Science Forum, vols. 423-425, pp. 405-410, 2003.

(Continued)

*Primary Examiner*—Mihn Trinh
*Assistant Examiner*—Tai Nguyen
(74) *Attorney, Agent, or Firm*—Oliff & Berridge, PLC

(57) ABSTRACT

The present invention provides a simple method using aerosol deposition, for manufacturing a piezoelectric film that will simultaneously satisfy various characteristics required of a piezoelectric film. In the method, the piezoelectric film is formed on a substrate by ejecting an aerosol containing particles of a piezoelectric material onto the substrate so that the particles adhere thereto, and a second piezoelectric layer is formed on the first piezoelectric layer by conducting the ejection such that energy used for crushing the particles when the particles collide with the substrate is less than in the formation of the first piezoelectric film.

11 Claims, 4 Drawing Sheets

FOREIGN PATENT DOCUMENTS

JP     A 2000-328223     11/2000
JP     A 2001-152360     6/2001

OTHER PUBLICATIONS

Jun Akedo et al., "Influence of Carrier Gas Conditions on Electrical and Optical Properties of Pb(Zr,Ti)$O_3$ Thin Films Prepared by Aerosol Deposition Method," Jpn. J. Appl. Phys., vol. 40, Part 1, No. 9B, pp. 5528-5532, 2001.

Maxim Lebedev et al., "Effect of Thickness on the Piezoelectric Properties of Lead Zirconate Titanate Films Fabricated by Aerosol Deposition Method," Jpn. J. Appl. Phys., vol. 41, Part 1, No. 11B, pp. 6669-6673, Nov. 2002.

Masafumi Nakada et al., "Electro-Optical Properties of (Pb, La)(Zr, Ti)$O_3$ Films Prepared by Aerosol Deposition Method," Jpn. J. Appl. Phys., vol. 42, Part 1, No. 9B, pp. 5960-5962, Sep. 2003.

* cited by examiner

METHOD FOR MANUFACTURING A PIEZOELECTRIC FILM ON A SUBSTRATE

BACKGROUND OF THE INVENTION

1. Field of the Invention

The present invention relates to a method for manufacturing a piezoelectric film, to a laminate structure of a substrate and a piezoelectric film, to a piezoelectric actuator, and to a method for manufacturing the same.

2. Description of the Related Art

A method called aerosol deposition (AD) is one way to manufacture piezoelectric actuators and the like used in the printer heads of inject printers and so on. This method involves dispersing microparticles of a piezoelectric material in gas to produce an aerosol, and ejecting this aerosol toward a substrate surface, and causing the microparticles to collide with and be deposited on the substrate to form a piezoelectric film (see Japanese Patent Application Laid-Open No. 2001-152360 and Japanese Patent Application Laid-Open No. H11-330577, for example).

SUMMARY OF THE INVENTION

According to the research conducted by the inventors, there has been found a correlation between film formation conditions and the characteristics of the resulting piezoelectric film. For instance, if the ejection velocity of the aerosol onto the substrate is raised, the adhesion of the film to the substrate and the dielectric strength characteristics of the film improve, but the piezoelectric characteristics of the film tend to deteriorate. Furthermore, satisfactory piezoelectric characteristics are not always obtained even if annealing is performed (a treatment in which the film is heated for improving its piezoelectric characteristics). Thus, it was difficult to find film formation conditions under which the various characteristics required of a piezoelectric film would simultaneously be satisfied.

The present invention was made in view of the above-mentioned situation, and it is an object thereof to provide a simple method for manufacturing a piezoelectric film that will simultaneously satisfy the various characteristics required thereof.

The present inventors made the following discoveries upon conducting diligent research aimed at developing a simple method for manufacturing a piezoelectric film that will simultaneously satisfy the various characteristics required thereof.

As described above, in the AD method, piezoelectric film adhesion and dielectric strength characteristics improve when the ejection velocity is raised. The reasons for this are considered to be that the collision of the material particles with the substrate crushes the particles, causing them to lodge in the substrate and take on a fine structure and resulting in a solid grain boundary plane, and that the new surfaces of the particles and the substrate exposed by these collisions are high in an electrical and chemical activity, so the electrical and chemical bonding power between the substrate and the particles becomes stronger. In this case, it is quite conceivable that the grain boundary planes of these particles that have taken on a fine structure will be complex, so it is surmised that there is an increase in the grain boundary distance in the thickness direction of the piezoelectric film.

On the other hand, if the ejection velocity is lowered, there will be a decrease in adhesion and the dielectric strength characteristics, but satisfactory piezoelectric characteristics can still be obtained by performing annealing after film formation. The reasons for this are thought to be that a lower collision energy with the substrate increases the number of material particles that adhere without being crushed, which increases the number of crystals with a large grain size in the piezoelectric film, and that fewer defects in the particle structure (such as lattice defects, strain, dislocation, and holes) mean that annealing results in greater restoration of the characteristics. Specifically, it is believed that structural defects in the particles increase in proportion to average energy used for crushing one particle.

Energy possessed by a particle before a collision is not necessarily used for crushing the particle when it collides with the substrate. Only some of the energy may be used for crushing the particle, or almost none of the energy may be used for crushing the particle. If a particle is not crushed by a collision, energy used for crushing the particle is zero. Increase of the number of particles that are not crushed leads to decrease of the average energy used for crushing one particle. Increase of the number of particles that are crushed finer leads to increase of the average energy.

Therefore, a film formation is first conducted under conditions in which the average energy is relatively greater, thereby producing a layer with good adhesion, and then a layer with good piezoelectric characteristics is formed on this first layer by forming a film under conditions in which the average energy its relatively smaller. This allows the production of a piezoelectric film having a layer with good adhesion on the side facing the substrate, and having a layer with good piezoelectric characteristics on the outside, and makes it possible to achieve both good adhesion to the substrate and good piezoelectric characteristics. The present invention was conceived on the basis of these new findings.

Specifically, the present invention provides a method for manufacturing a piezoelectric film on a substrate by ejecting an aerosol containing particles of a piezoelectric material onto the substrate so that the particles adhere thereto, comprising:

a first film formation step of forming a first piezoelectric layer on the substrate; and a second film formation step of forming a second piezoelectric layer on the first piezoelectric layer, wherein at least some or the particles are crushed when the particles collide with the substrate or the first piezoelectric layer in the first and second film formation steps; and average energy used for crushing one of the particles in the second film formation step is less than in the first film formation step.

The lowering of the average energy in the second film formation step than that in the first film formation step can be accomplished, for example, by lowering the concentration of the particles in the aerosol, by reducing the ejection velocity of the particles within the aerosol, by reducing the angle at which the aerosol is ejected onto the substrate, by changing the size or material of the particles in the aerosol, or by combining these approaches.

For instance, if the average energy is adjusted by varying the aerosol ejection velocity, the ejection velocity is preferably set to at least 300 m/sec in the first film formation step, and even more preferably to at least 300 m/sec and not more than 450 m/sec. In the second film formation step, this velocity is preferably at least 150 m/sec and less than 300 m/sec, and even more preferably at least 150 m/sec and not more than 200 m/sec.

After the second film formation step, a third piezoelectric layer may be laminated by conducting the ejection such that the average energy is greater than in the second film formation step. This gives a piezoelectric film structured such that an intermediate second layer is sandwiched between the first and third layers that are solid and have high dielectric strength. A structure such as this maintains good piezoelectric characteristics while improving the dielectric strength characteristics of the film as a whole.

Also, an annealing treatment in which the piezoelectric film is heated may be performed after completion of all the film formation steps.

The present invention also provides a method for manufacturing a piezoelectric actuator, in which a piezoelectric film is formed on a conductive substrate constituting one of a pair of positive and negative electrodes, or on a conductive intermediate layer formed on the conductive substrate, by ejecting an aerosol containing particles of a piezoelectric material onto the conductive substrate or the conductive intermediate layer so that the particles adhere thereto, comprising:

a first film formation step of forming a first piezoelectric layer on the conductive substrate or the conductive intermediate layer;

a second film formation step of forming a second piezoelectric layer on the first piezoelectric layer; and an electrode layer formation step of forming an electrode layer constituting the other of the pair of electrodes over the second piezoelectric layer, wherein at least some of the particles are crushed when the particles collide with the conductive substrate, the conductive intermediate layer or the first piezoelectric layer in the first and second film formation steps; and average energy used for crushing one of the particles in the second film formation step is less than in the first film formation step.

The present invention also provides a laminate structure, comprising a substrate and a piezoelectric film formed by ejecting an aerosol containing particles of a piezoelectric material onto the substrate or an intermediate layer formed over the substrate so that the particles adhere thereto, wherein the piezoelectric film is produced by laminating a plurality of different layers formed by varying average energy used for crushing one of the particles when the particles collide with the substrate or the intermediate layer.

It is preferable if, of the plurality of different layers, the layer next to the substrate or the intermediate layer has adhesive strength of at least 20 MPa with the substrate or intermediate layer, has a relative dielectric constant of at least 800, and has a dielectric strength of at least 350 kv/cm.

Also, it is preferable if the piezoelectric film produced by the lamination of a plurality of layers has adhesive strength of at least 20 MPa with the substrate or the intermediate layer, has a relative dielectric constant of at least 800, and has a dielectric strength of at least 350 kv/cm.

Also, the present invention can be applied favorably to a piezoelectric actuator used in, e.g., the printer heads of inject printers. In this case, a conductive material is used for the substrate, this is used as one of the electrodes, and an electrode layer constituting the other electrode is formed on the piezoelectric film.

With the present invention, a piezoelectric film having a layer with good adhesion on the side facing the substrate, and having a layer with good piezoelectric characteristics on the outside can be produced, and both good adhesion to the substrate and good piezoelectric characteristics can be achieved. Also, since layers having different properties can be laminated by the same AD method merely by varying the film formation conditions, it is possible to obtain a piezoelectric film having good characteristics without a complicated manufacturing process.

Furthermore, the present invention provides a piezoelectric actuator, comprising a substrate and a piezoelectric film formed on the substrate by ejecting an aerosol containing particles of a piezoelectric material onto the substrate so that the particles adhere thereto, wherein the piezoelectric film comprises a first piezoelectric layer formed on the substrate, and a second piezoelectric layer formed on the first piezoelectric layer, and the particles constituting the first piezoelectric layer are crushed finer than the particles constituting the second piezoelectric layer by conducting the ejection such that average energy used for crushing one of the particles when the particles collide with the substrate in a formation of the first piezoelectric layer is greater than average energy used for crushing one of the particles when the particles collide with the first piezoelectric layer in a formation of the second piezoelectric layer.

DESCRIPTION OF THE PREFERRED EMBODIMENTS

Figure 1:
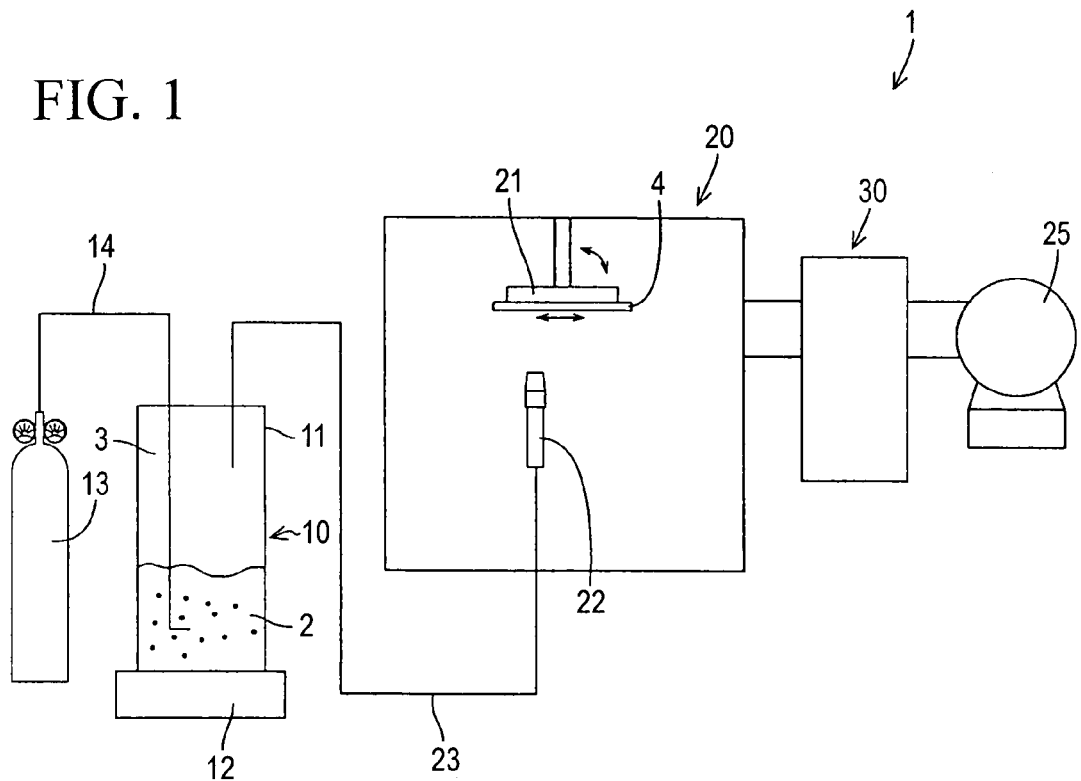
FIG. 1 is a schematic diagram of the film formation apparatus of the present invention.

FIG. 1 is a schematic diagram of the film formation apparatus used to form the piezoelectric film of the present invention. This film formation apparatus 1 is equipped with an aerosol generator 10 for forming an aerosol 3 by dispersing material particles 2 in a carrier gas, a film formation chamber 20 for ejecting the aerosol 3 from a nozzle and causing the aerosol to adhere to a substrate, and a powder recovery apparatus 30 for recovering the material particles 2 from the aerosol 3 having been used.

The aerosol generator 10 is equipped with an aerosol chamber 11 capable of accommodating particles 2 of a piezoelectric material in its interior, and a vibrating apparatus 12 that is attached to this aerosol chamber 11 for vibrating the aerosol chamber 11. A gas cylinder 13 for introducing a carrier gas is connected to the aerosol chamber 11 via an introduction pipe 14. The end of the introduction pipe 14 is located inside and near the bottom of the aerosol chamber 11, and is submerged in the material particles 2. Examples of the carrier gas include an inert gas such as helium, argon, nitrogen or the like, or the other gas such as air, oxygen or the like. There are no particular restrictions on the piezoelectric material as long as it is one that is normally used as a material for piezoelectric films. Examples thereof include lead zirconate titanate (PZT), rock crystal, lithium niobate, barium titanate, lead titanate, lead metaniobate, zinc oxide or the like.

The film formation chamber 20 is equipped with a stage 21 for attaching a substrate 4, and an ejection nozzle 22 provided below this stage 21. The ejection nozzle 22 is connected to the aerosol chamber 11 via an aerosol supply pipe 23, and the design is such that the aerosol 3 inside the aerosol chamber 11 is supplied through the aerosol supply pipe 23 to the ejection nozzle 22. A drive apparatus (not shown) allows the stage 21 to move in the substrate planar direction with the substrate 4 attached, and the angle of the substrate plane with respect to the direction in which the aerosol is ejected from the ejection nozzle 22 can also be adjusted (see the arrows in the middle of FIG. 1). Also, a vacuum pump 25 is connected to this film formation chamber 20 via the powder recovery apparatus 30, allowing the interior of the chamber to be put under reduced pressure.

Figure 2:
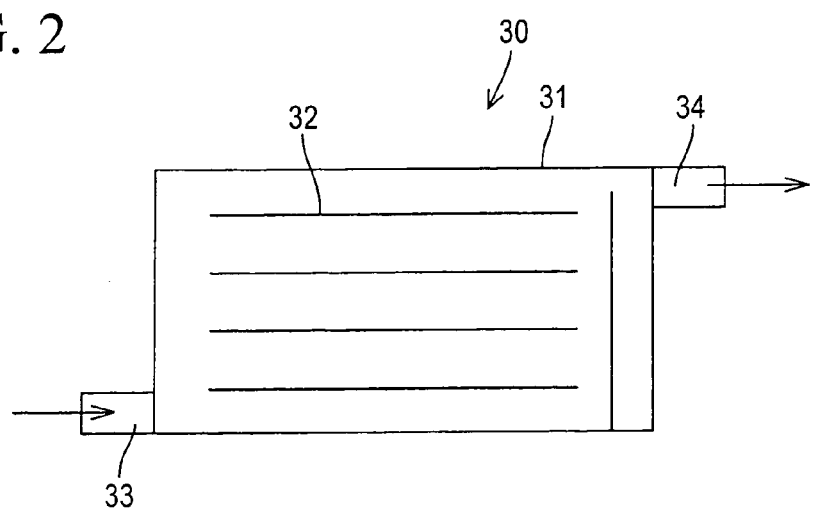
FIG. 2 is a top view of the powder recovery apparatus used in the film formation apparatus.
Figure 3:
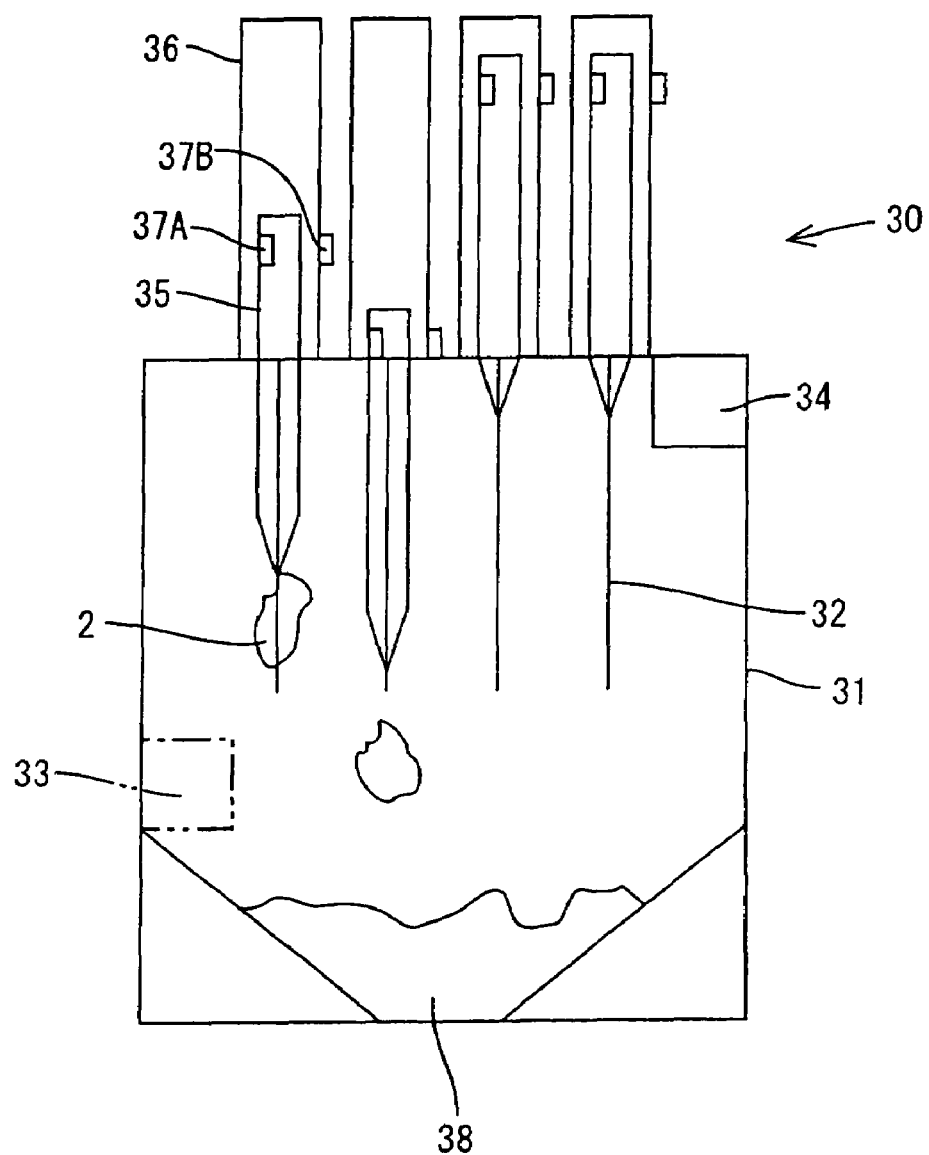
FIG. 3 is a side view of the powder recovery apparatus used in the film formation apparatus.

The powder recovery apparatus 30 is an electric dust collector, and a plurality of dust filters 32 are disposed in parallel inside a dust trap 31 (see FIGS. 2 and 3). When the aerosol 3 comes in through an intake port 33 connected to the film formation chamber 20, the material particles 2 contained in the aerosol are charged by a charger (not shown). As the aerosol 3 passes through the dust filters 32, the charged particles 2 are adsorbed to the dust filters 32 by electrostatic attraction. The carrier gas from which the particles 2 have been removed is exhausted from an exhaust port 34 connected to the vacuum pump 25.

Each of the dust filters 32 is provided with a scraper 35 capable if moving up and down along the both sides of each filter 32. When not being used, the scrapers 35 are stowed in scraper holders 36 provided at the top of the dust trap 31. A magnet 37A is attached to the upper end of each of the scrapers 35, and magnets 37B corresponding to the magnets 37A on the scraper side are attached to the outer peripheral surfaces of the scraper holders 36. The magnets 37B on the side of the scraper holders 36 are capable of moving up and down along the outer peripheral surface of the scraper holders 36. When the scrapers 35 are operated, the magnets 37B of the scraper holders 36 move downward. As a result, the scrapers 35 are moved downward by the interaction between the magnets 37B of the scraper holders 36 and the magnets 37A of the scrapers 35, and scrape off the particles 2 adhering to the surface of the dust filters 32. A hopper 38 is provided at the bottom of the dust filters 32, and the dust that is scraped off falls into this hopper 38 and is recovered. With this type of electric dust collector, the dust filters 32 are generally cleaned by applying an opposite charge in a batch operation, but since the interior of the apparatus here must be kept in a state of reduced pressure, and the flow of the aerosol 3 cannot be stopped, this cleaning is performed with the scrapers 35.

When a piezoelectric film is to be formed using this film formation apparatus 1, the material particles 2 are poured into the aerosol chamber 11. The carrier gas is then introduced from the gas cylinder 13, and the gas pressure causes the material particles 2 to surge upward. At the same time, the aerosol chamber 11 is vibrated by the vibrating apparatus 12, which mixes the material particles 2 and the carrier gas and generates the aerosol 3. The inside of the film formation chamber 20 is reduced in pressure by the vacuum pump 25, and the difference in pressure between the aerosol chamber 11 and the film formation chamber 20 accelerates the aerosol 3 in the aerosol chamber 11 to a high speed and ejects it out of the ejection nozzle 22. The material particles 2 contained in the ejected aerosol 3 collide with and deposit on the substrata 4, forming a piezoelectric film. The ejection of the aerosol is performed while the substrate 4 is moved in the planar direction by the drive apparatus attached to the stage 21, so that the piezoelectric film is formed over the entire surface of the substrate 4.

Figure 4A:
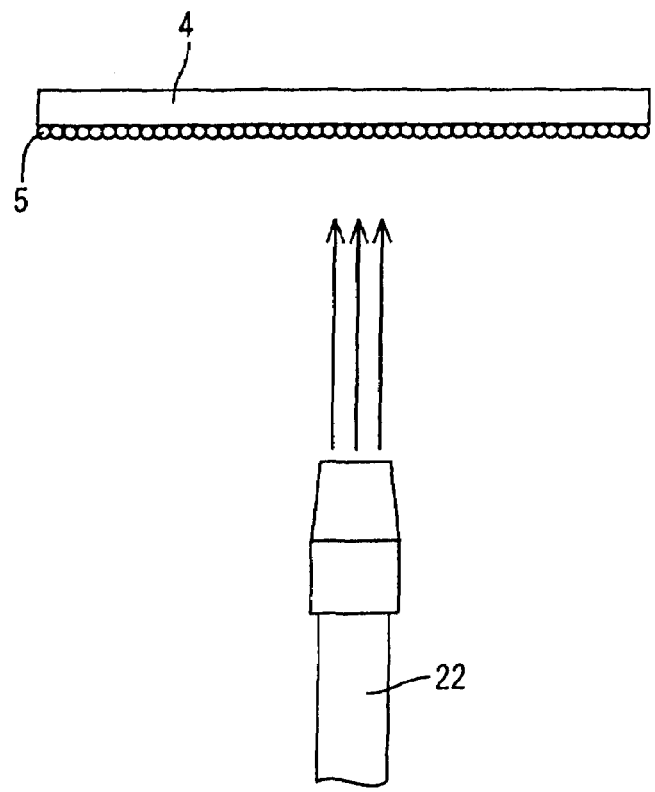
FIGS. 4A and 4B are side views of how piezoelectric films are formed at different ejection velocities.
Figure 4B:
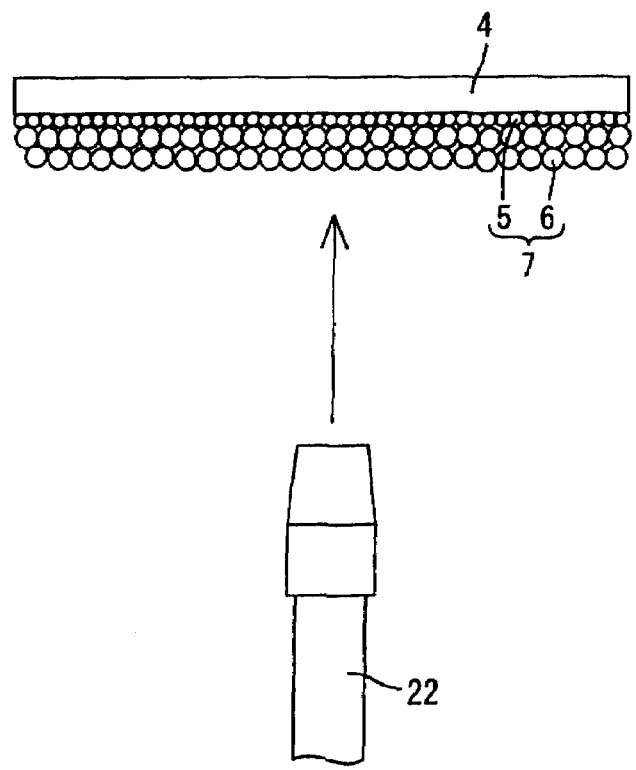

As shown in FIG. 4A, film formation is first performed under conditions in which the average energy used for crushing one particle is relatively greater, creating a first piezoelectric layer 5 with good adhesion (first film formation step), after that, as shown in FIG. 4B, film formation is performed under conditions in which the average energy is relatively smaller, forming on this first layer a second piezoelectric layer 6 with good piezoelectric characteristics (second film formation step). Thus, a two-layer piezoelectric film 7 is formed. After film formation, annealing may be performed if needed, in which the piezoelectric film 7 is heated to at least 500° C. for the purpose of restoring the piezoelectric characteristics.

The average energy for crushing can be adjusted by varying the film formation conditions, such as the particle concentration of the aerosol 3, the collision velocity, or the ejection angle onto the substrate.

For instance, when the average energy is adjusted by varying the collision velocity of the particles in the aerosol, the ejection velocity in the second film formation step may be set to be lower than that in the first film formation step. More specifically, it is preferable for the ejection velocity to be at least 300 m/sec in the first film formation step, and to be at least 150 m/sec and less than 300 m/sec in the second film formation step. It is even more preferable for the ejection velocity to be at least 300 m/sec and not more than 450 m/sec in the first film formation step, and to be at least 150 m/sec and not more than 200 m/sec in the second film formation step.

When the average energy is adjusted by varying the concentration of the particles in the aerosol, the particle concentration in the second film formation step may be set lower than that in the first film formation step. When the average energy is adjusted by varying the angle at which the aerosol is ejected onto the substrate, the ejection angle in the second film formation step may be set lower than that in the first film formation step.

As a results the material particles are finely crushed by a greater energy in the first film formation step, causing them to lodge well in the substrate and take on a fine structure, so a layer having a solid grain boundary plane and high adhesion can be produced. Meanwhile, in the second film formation step, the energy is relatively low, so the original material particles form a film with fewer structural defeats than in the first layer, and some of the material particles are taken into the layer without being crushed, retaining the size they had prior to collision, so a layer can be produced with better piezoelectric characteristics than the first layer. Thus, it is possible to produce a piezoelectric film having a layer with good adhesion on the side facing the substrate, and a layer with good piezoelectric characteristics on the outside, so good adhesion to the substrate and good piezoelectric characteristics can both be achieved. Since layers having different properties can be laminated by the same AD method merely by varying the film formation conditions, it is possible to obtain a piezoelectric film having good characteristics without a complicated manufacturing process.

The favourable ranges for the other film formation conditions will vary with the other film formation conditions and so forth, and as such cannot be specified unconditionally, but, for example, an excellent piezoelectric film can be formed under conditions in which the pressure inside the film formation chamber is 50 to 400 Pa, the pressure inside the aerosol chamber is 1000 to 80,000 Pa, the nozzle aperture is 10×0.4 mm, the carrier gas is helium or air, the nozzle speed relative to the substrate is 1.2 mm/sec, the distance of the nozzle from the substrate is 10 to 20 mm, and the average size of the material particles is 0.3 to 1 μm.

A solid layer produced by high energy has good dielectric strength characteristics, and therefore a third piezoelectric layer may be laminated after the second film formation step by ejecting the particles 2 such that the average energy used for crushing one particle will be greater than that in the second film formation step. This creates a sandwich structure of piezoelectric films, in which a second piezoelectric layer with good piezoelectric characteristics is sandwiched between the first and third piezoelectric layers with good dielectric strength characteristics, which maintains good piezoelectric characteristics while improving the dielectric strength characteristics of the film as a whole.

Also, an intermediate layer composed of titanium or other material with good adhesion to the particles may be provided over the substrate, and the material particles may collide with this intermediate layer in the first film formation step. This ensures good layer adhesion even if the collision energy is not so extremely high in the first film formation step.

The present invention can be applied favorably to piezoelectric actuators used in the printer heads of inject printers and so on. In this case, a conductive material is used for the substrate, this is used as one of the electrodes, and an electrode layer constituting the other electrode may be formed on the piezoelectric film having been formed.

Figure 5:
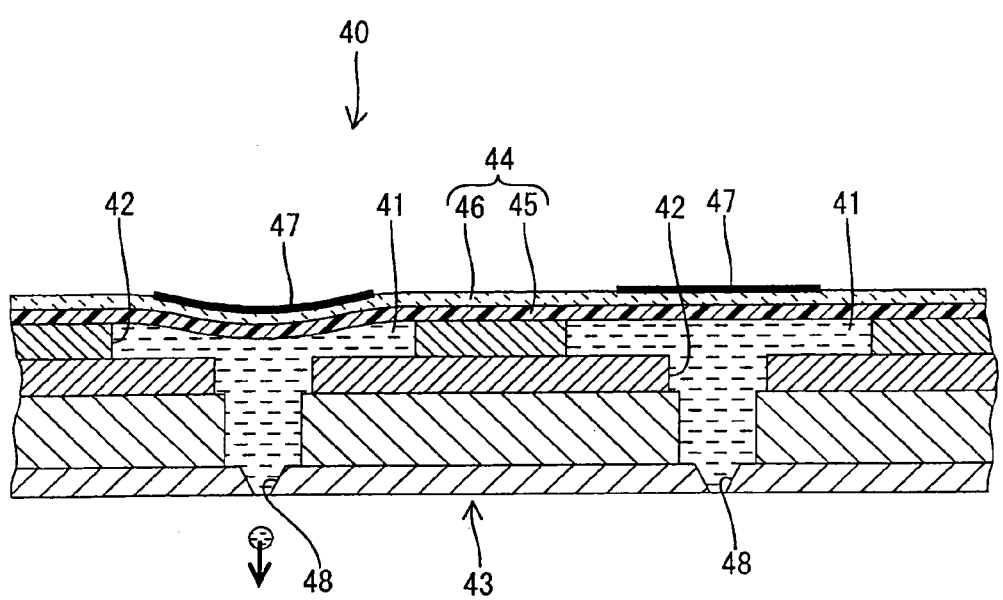
FIG. 5 is a cross section side view of the piezoelectric actuator of the present invention.

FIG. 5 illustrates an embodiment of applying the present invention to a piezoelectric actuator used in an inkjet head. An inkjet head 40 comprises a passage unit 43 equipped with a plurality of pressure chambers 42 containing ink 41, and an actuator plate 44 (corresponds to the piezoelectric actuator of the present invention) joined over this passage unit 43 so as to close off the pressure chambers 42. The actuator plate 44 comprises a diaphragm 45 (corresponds to the conductive substrate of the present invention) that makes up part of the pressure chambers 42, and a piezoelectric film 46 laminated over the entire surface of this diaphragm 45 on the opposite side from the pressure chambers 42. The diaphragm 45 is formed in a rectangular shape and made from stainless steel or other such conductive metal material, and is joined to the top of the passage unit 43 with a thermosetting epoxy adhesive so as to cover the entire top side of the passage unit 43. This diaphragm 45 is connected to the ground of a drive circuit IC (not shown), and is also used as a lower electrode.

The piezoelectric film 46 is formed from zirconate titanate (PZT) or other such ferroelectric piezoelectric ceramic materials, and is laminated in uniform thickness over the entire surface of the diaphragm 45. This piezoelectric film 46 is formed by the aerosol deposition method, and comprises two layers: a first piezoelectric layer formed over the diaphragm 45, and a second piezoelectric layer laminated over this first piezoelectric layer.

An upper electrode 47 (corresponds to the electrode layer of the present invention) is provided on the top aide of this piezoelectric film 46, on the opposite side from the side in contact with the diaphragm 45. This upper electrode 47 is formed in a specific shape by printing or other such methods from a thin-film conductor, and is connected to a drive circuit IC.

The piezoelectric film 46 on the diaphragm 45 is subjected to a polarization treatment so as to be polarized in its thickness direction, and when the drive circuit IC causes the potential of the upper electrode 47 to be higher than the potential of the diaphragm 45 (which is the lower electrode), an electric field is applied to the piezoelectric film 46 in the polarization direction (thickness direction) thereof. This causes the piezoelectric film 46 to expand in its thickness direction and contract in its planar direction. As a result, the piezoelectric film 46 and the diaphragm 45 (that is, the actuator plate 44) are locally deformed so as to protrude on the pressure chamber 42 side (unimorph deformation). Accordingly, there is a drop in the volume of the pressure chambers 42, the pressure on the ink 41 increases, and the ink 41 is ejected out of nozzles 48. After this, when the upper electrode 47 is returned to the same potential as the diaphragm 45 (the lower electrode), since the piezoelectric film 46 and the diaphragm 45 return to their original form and the volumes of the pressure chambers 42 return to its original level, ink 41 is drawn in through a manifold (not shown) communicating with an ink tank.

Here, first the piezoelectric film 46 is produced by forming a first piezoelectric layer with good adhesion over the diaphragm 45 by performing film formation under conditions of greater particle collision energy, and then forming a second piezoelectric layer with good piezoelectric characteristics over this by performing film formation under conditions of less particle collision energy. This makes it possible to achieve both good adhesion of the piezoelectric film 46 to the diaphragm 45 and good piezoelectric characteristics. Also, as discussed above, an intermediate layer may be formed in advance over the diaphragm 45, and the first piezoelectric layer formed over this intermediate layer.

EXAMPLES

The present invention will now be described in further detail by giving Examples.

Comparison of Two-Layer Piezoelectric Film and Single-Layer Piezoelectric Film

Example 1

1) Film Formation

A sheet of ferritic stainless steel (SUS430 prescribed by Japanese Industrial Standards) with a Vickers hardness Hv of 300 was used as a substrate. PZT with a Vickers hardness Hv of 300 to 400 and an average particle size of 0.3 to 1 μm was used as the material particles. A piezoelectric film was formed on the substrate with the sample film formation apparatus as in the embodiment described above. The Vickers hardness of the substrate and the particles was measured with a Nano-Hardness Tester made by +CSM Instruments.

Here, a first piezoelectric layer was formed on the substrate by ejecting the particles of PZT at a particle velocity of 400 m/sec (first film formation step), and then a second piezoelectric layer was formed on this first piezoelectric layer by ejecting the same at a particle velocity of 170 m/sec (second film formation step). After this, annealing was performed for 1 hour at 600° C. to form a piezoelectric film with a thickness of 10 μm.

The other film formation conditions comprised the following: the pressure inside the film formation chamber was 150 Pa, the pressure inside the aerosol was 30000 Pa, the nozzle aperture was 10×0.4 mm, the carrier gas was helium, the nozzle speed relative to the substrate was 1.2 mm/sec, and the distance of the nozzle from the substrate was 10 to 20 mm.

2) Test

The piezoelectric film thus obtained was measured for dielectric breakdown voltage and P-E hysteresis at room temperature.

Comparative Example 1

A piezoelectric film was formed in a single film formation step at a particle velocity of 400 m/sec. The remaining film formation conditions were the same as in Example 1. The piezoelectric film thus obtained was tested in the same manner as in Example 1.

Comparative Example 2

A piezoelectric film was formed in a single film formation step at a particle velocity of 170 m/sec. The rest of the film formation conditions were the same as in Example 1. The piezoelectric film thus obtained was tested in the same manner as in Example 1.

Aerosol Ejection Velocity and Characteristics of Piezoelectric Film

Example 2

Piezoelectric films were formed in a single film formation step by varying the particle velocity between 150 and 450 m/sec. The rest of the film formation conditions were the same as in Example 1. The piezoelectric films thus obtained were tested in the same manner as in Example 1.

Results and Discussion

1. Comparison of Two-Layer Piezoelectric Film and Single-Layer Piezoelectric Film 1) Adhesion Adhesion was measured by tensile test with a tensile tester. More specifically, in this test, a jig with a cross sectional area of 25 mm$^2$ was bonded with an epoxy-based adhesive to the surface of the film that had been formed, and this jig was then pulled off.

The piezoelectric films adhered tightly to the substrate both when two layers of piezoelectric film were formed at a particle velocity of 400 m/sec and 170 m/sec (Example 1) and when one layer of piezoelectric film was formed at a particle velocity of 400 m/sec (Comparative Example 1). The piezoelectric films here were confirmed to have an adhesive strength of at least 20 MPa. In contrast, in Comparative Example 2, in which the particle velocity was 170 m/sec, a film was formed, but its adhesion to the substrate was so weak that the film separated from the substrate when bonded to the film.

2) Piezoelectric Characteristics

A piezoelectric actuator was produced by forming an upper electrode of 2×2 mm by vapor deposition of gold on the piezoelectric film, and using the ferritic stainless steel (SUS430 prescribed by Japanese Industrial Standards) sheet serving as the substrate for the lower electrode. The dielectric/piezoelectric characteristics of this piezoelectric actuator were measured and evaluated with a ferroelectric raster.

When one layer of piezoelectric film was formed at a particle velocity of 400 m/sec (Comparative Example 1), the residual polarity Pr was 25 μC/cm$^2$, the coercive electric field Ec was 170 kV/cm, and the specific dielectric constant $\epsilon_0$ was 481. In contrast, when two layers of piezoelectric film were formed at a particle velocity of 400 m/sec and 170 m/sec (Example 1), the residual polarity Pr was 35 μC/cm$^2$, which was higher than that in Comparative Example 1, and the coercive electric field Ec was 60 kV/cm, which was greatly improved over Comparative Example 1. The specific dielectric constant $\epsilon_0$ here was 849.

In Comparative Example 2, in which the particle velocity was 170 m/sec, although a film was formed, separation from the substrate occurred when the upper electrode was formed on the film, so the piezoelectric characteristics could not be evaluated.

3) Dielectric Strength Characteristics

The dielectric breakdown voltage of the piezoelectric actuators discussed above were measured with a trickle current meter and evaluated.

When one layer of piezoelectric film was formed at a particle velocity of 400 m/sec (Comparative Example 1), the dielectric breakdown voltage was 500 kV/cm. In contrast, when two layers of piezoelectric film were formed by varying the particle velocity between 400 m/sec (first film formation step) and 170 m/sec (second film formation step) (Example 1), the dielectric breakdown voltage was 450 kV/cm. Thus, in Example 1, in which a second piezoelectric layer was formed at a lower particle velocity, the dielectric breakdown voltage did decrease slightly, but the dielectric strength characteristics were nearly on a par with those in Comparative Example 1, which comprised just one layer formed at a high particle velocity.

In Comparative Example 2, in which the particle velocity was 170 m/sec, the dielectric strength characteristics could not be evaluated because separation from the substrate occurred.

2. Ejection Velocity and Piezoelectric Layer Characteristics

As to the adhesion of the particles to the substrate, at an ejection velocity of less than 150 m/sec, the particles adhered to the substrate extremely poorly, and the film formation was extremely slow. When the ejection velocity was at least 150 m/sec, this ensured the minimum energy required for the particles to adhere to the substrate, and a film was formed at a practical rate, but it still took a long time to form a layer of a certain thickness. When the ejection velocity was at least 300 m/sec, the particles adhered securely to the substrate, or to the particle layer already adhering to the substrate, and a thick layer was formed in a short time. When the ejection velocity was over 450 m/sec, there was no problem whatsoever with adhesion, but it was confirmed that internal stress in the formed layer resulted in elastic deformation of the substrate.

Meanwhile, the piezoelectric characteristics were deteriorated slightly when the ejection velocity was over 200 m/sec.

These results shows that in the formation of the first piezoelectric layer, which should have adequate adhesion to the substrate, the ejection velocity is preferably set to at least 300 m/sec, and that 450 m/sec or less is particularly favorable in order to prevent the layer itself from cracking due to internal stress. In the formation of the second piezoelectric layer, which should have piezoelectric characteristics improved while ensuring adequate adhesion and a practical rate of film formation, it can be seen that the ejection velocity is preferably at least 150 m/sec and less than 300 m/sec, and especially at least 150 m/sec and not more than 200 m/sec.

3. Conclusion

As discussed above, it was found that a piezoelectric film that has good adhesion to the substrate and also has good piezoelectric characteristics and dielectric strength characteristics can be obtained by laminating a first piezoelectric layer formed at a high ejection velocity and a second piezoelectric layer formed at a low ejection velocity.

The entire disclosure of the specification, claims, summary and drawings of Japanese Patent Application No. 2004-099006 riled on Mar. 30, 2004 is hereby incorporated by reference.

What is claimed is:

1. A method for manufacturing a piezoelectric film on a substrate by ejecting an aerosol containing particles of a piezoelectric material onto the substrate so that the particles adhere thereto, comprising:

a first film formation step of forming a first piezoelectric layer on the substrate by causing the particles to collide with the substrate; and a second film formation step of forming a second piezoelectric layer on the first piezoelectric layer by causing the particles to collide with the first piezoelectric layer;

wherein:
at least some of the particles are crushed when the particles collide with the substrate in the first film formation step, and when the particles collide with the first piezoelectric layer in the second film formation steps; and
an average energy used for crushing one of the particles in the second film formation step is less than in the first film formation step.

2. The method for manufacturing a piezoelectric film according to claim 1, wherein the particle concentration in the aerosol is lower in the second film formation step than in the first film formation step.

3. The method for manufacturing a piezoelectric film according to claim 1, wherein the aerosol ejection velocity is lower in the second film formation step than in the first film formation step.

4. The method for manufacturing a piezoelectric film according to claim 1, wherein the ejection angle at which the aerosol is ejected onto the substrate is smaller in the second film formation step than in the first film formation step.

5. The method for manufacturing a piezoelectric film according to claim 3, wherein the aerosol ejection velocity in the first film formation step is at least 300 m/sec, while the aerosol ejection velocity in the second film formation step is at least 150 m/sec and less than 300 m/sec.

6. The method for manufacturing a piezoelectric film according to claim 3, wherein the aerosol ejection velocity in the first film formation step is at least 300 m/sec and not more than 450 m/sec, while the aerosol ejection velocity in the second film formation step is at least 150 m/sec and not more than 200 m/sec.

7. The method for manufacturing a piezoelectric film according to claim 1, further comprising a third film formation step of forming a third piezoelectric layer on the second piezoelectric layer, following the second film formation step, wherein at least some of the particles are crushed when the particles collide with the second piezoelectric layer in the third formation step, and average energy used for crushing one of the particles in the third film formation step is greater than in the second film formation step.

8. The method for manufacturing a piezoelectric film according to claim 1, wherein an annealing step of heating the piezoelectric film is performed after the completion of all the film formation steps.

9. The method according to claim 1, wherein the substrate is a conductive substrate constituting one of a pair of positive and negative electrodes, and the piezoelectric film is included in a piezoelectric actuator,
and wherein the first film formation step forms the first piezoelectric layer on the conductive substrate or on a conductive intermediate layer formed on the conductive substrate, by causing the particles to collide with the conductive substrate or the conductive intermediate layer;
the method further comprising an electrode layer formation step of forming an electrode layer constituting the other of the pair of electrodes over the second piezoelectric layer, wherein at least some of the particles are crushed when the particles collide with the conductive substrate or the conductive intermediate layer in the first film formation step, or when the particles collide with the first piezoelectric layer in the second film formation step.

10. The method according to claim 9, wherein, after the second film formation step, a third piezoelectric layer is formed on the second piezoelectric layer in a third film formation step, and the electrode layer is formed on the third piezoelectric layer, and wherein at least some of the particles are crushed when the particles collide with the second piezoelectric layer in the third film formation step; and average energy used for crushing one of the particles in the third film formation step is greater than in the second film formation step.

11. The method according to claim 9, wherein an annealing step of heating the piezoelectric film is performed after the completion of all the film formation steps.

* * * * *